United States Patent
Ito

[11] Patent Number: 5,962,341
[45] Date of Patent: Oct. 5, 1999

[54] SEMICONDUCTOR DEVICE AND MANUFACTURING METHOD THEREFOR

[75] Inventor: Shinya Ito, Tokyo, Japan

[73] Assignee: NEC Corporation, Tokyo, Japan

[21] Appl. No.: 08/926,119

[22] Filed: Sep. 9, 1997

[30] Foreign Application Priority Data

Sep. 9, 1996 [JP] Japan .................................. 8-237545

[51] Int. Cl.⁶ ........................................... H01L 21/00
[52] U.S. Cl. .................... 438/692; 438/697; 438/737; 257/752; 257/759; 257/760; 257/784
[58] Field of Search .................... 438/637, 645, 438/672, 692, 697, 737; 216/38, 88; 257/752, 758, 759, 760, 784

[56] References Cited

U.S. PATENT DOCUMENTS

| | | | |
|---|---|---|---|
| 4,702,792 | 10/1987 | Chow et al. ............................ | 438/692 |
| 5,266,446 | 11/1993 | Chang et al. ......................... | 438/692 X |
| 5,691,219 | 11/1997 | Kawakubo et al. ................. | 438/692 X |

FOREIGN PATENT DOCUMENTS

| | | |
|---|---|---|
| 58-48941 | 3/1983 | Japan . |
| 2-19977 | 5/1990 | Japan . |

*Primary Examiner*—William Powell

[57] ABSTRACT

A prescribed region of a polyacetylene film that is provided on the flattened surface of a first interlayer insulating film is doped so as to form an upper wiring layer on the polyacetylene film. A second interlayer insulating film which covers this polyacetylene film has a flattened surface which is formed by lamination of a polyimide film onto a silicon oxide film. A via hole is filled with a contact plug that is formed by a conductive polyacetylene film, and a prescribed region of a polyacetylene film that covers the second interlayer insulating film is doped to form an upper wiring layer of that polyacetylene film.

17 Claims, 8 Drawing Sheets

(a)

(b)

(c)

SEMICONDUCTOR DEVICE AND MANUFACTURING METHOD THEREFOR

BACKGROUND OF THE INVENTION

1. Field of the Invention

The present invention relates to a semiconductor device and manufacturing method therefor, and more specifically to multilayer wiring in a semiconductor device using an acetylene film and a manufacturing method therefor.

2. Description of Related Art

With advancements in the level of integration of semiconductor devices, there has been an increased demands with respect to multilayer wiring. In multilayer wiring, because of the importance of covering steps between wiring layers and interlayer insulating films, and flatness of interlayer insulating films, electrically conductive polymers, such as linear eutectic conjugated polymers are attracting attention.

Of such linear conjugated eutectic polymers, the characteristics of polyacetylene ((CH)x) is particularly suited to semiconductor devices. Polyacetylene is a linear polymer having alternating C—C and C=C bonds, $\pi$ electrons which do not contribute to these bonds (being in a direction that is perpendicular to the linear bonding) being formed in a eutectic system, so that they have the possibility of contributing to electrical conductivity.

A polyacetylene film formed by a polymerization process of acethylen ((CH)2) utilizing a Ziegler-Natta catalyst or a polyacetylene film formed by plasma polymerization of acetylene is usually an insulating film.

While the electrical conductivity of an insulating polyacetylene film is in the range of approximately $10^{-9}$ to $10^{-8}$ S/cm, by doping an insulating polyacetylene film to several mol % with impurities (for example arsenic hexafluoride ($AsF_6$) or iodine ($I_2$)), it is possible to obtain an electrically conductive polyacetylene film having an electrical conductivity ranging from the order of $10^3$ S/cm or so to a maximum of $10^5$ S/cm or so (approximately the same as metals such as copper or silver).

By using the above-noted characteristics of a polyacetylene film, by selectively doping an insulating polyacetylene film over a prescribed region, it is possible to form an electrically conductive wiring region over just that region.

Additionally, if the polyacetylene region that remains as an insulating region is left as is without removing it, it is possible to avoid problems related to the ability to properly cover the steps formed on the top surface of the polyacetylene film, which includes the wiring layer, using an insulating film.

Further, the problem which is caused by covering ability over the steps formed by upper wiring layer formed on upper surface of an insulating film, can also be removed.

Because of this advantage, the application of multilayer wiring made from a polyacetylene film in semiconductor devices has been indicated in the past. For example, in Japanese Unexamined Patent Publication (KOKAI) No. 58-48941 there is disclosed two-layer wiring which uses a three-layer polyacetylene film, and in Japanese Examined Patent Application publication H2-19973 (Japanese Unexamined Patent Publication (KOKAI) No. 58-48942), there is disclosed two-layer wiring which includes two-layer aluminum wiring and a two-layer polyacetylene film.

Referring to FIG. 8, which shows a schematic representation of a semiconductor device, the multilayer wiring in the semiconductor device as disclosed in the above-noted Japanese Unexamined Patent Publication (KOKAI) No. 58-48491 (hereinafter referred to as the first prior art example) is as follows. The surface of the semiconductor substrate 301 is covered by a silicon oxide film 302 which has a flat upper surface.

Onto the upper surface of this silicon oxide film 302 are laminated an insulating first polyacetylene film 311, an insulating second polyacetylene film 321, and then an insulting third polyacetylene film 331.

Over a first prescribed region of the polyacetylene film 311 is provided a first wiring layer 311a which is converted so as to be electrically conductive, and over a second prescribed region of the polyacetylene film 331 is provided a second wiring layer 331a which is converted so as to be electrically conductive. The wiring layer 331a traverses laterally across the wiring layer 311a, via the polyacetylene film 321.

In the above-noted first prior art example, the upper surface of the wiring layer 311a and the upper surface of the polyacetylene film 311 are coplanar flat surfaces.

For this reason, the polyacetylene film 321 which serves as an interlayer insulating film also has a flat upper surface, this presenting no problem of covering a step or the like with the respect to the first wiring layer 311a.

Additionally, because the second wiring layer 331a also provided on the upper surface of the polyacetylene film 321, there is no problem in covering a step at the second wiring layer 331a as well.

Referring to FIG. 9, which shows a schematic representation of a semiconductor device, the multilayer wiring in the semiconductor device as disclosed in the above-noted Japanese Examined Patent Publication H2-19973 (hereinafter referred to as the second prior art example) is as follows.

Over a device isolation region of the surface of a P-type silicon substrate 401 a field oxide film 402 is provided, over a device region of the surface of the P-type silicon substrate 401 a gate electrode 403 is formed with an intervening gate oxide film 402A, and over the surface of a device region of the surface of the P-type silicon substrate 401 is provided an $N^+$-type diffusion layer 404 which serves as a source-drain region which is self-aligning to the field oxide film 402 and gate electrode 403.

Additionally, on the surface of these $N^+$ type diffusion region 404 is provided a platinum silicide layer 404A. An n-channel MOS transistor provided on the P-type silicon substrate 401 which includes the field oxide film 402 is covered by the insulating first polyacetylene film 411.

By selectively converting part of the polyacetylene film 411 that directly covers the platinum silicide film 404A so as to be electrically conductive, a first contact plug 411a is formed. Because a first aluminum wire 417 which is provided on the surface of the polyacetylene film 411 directly covers the upper end of the contact plug 411a, an electrical connection is made to the $N^+$ type diffusion layer 404.

The surface of the polyacetylene film 411, including the aluminum wiring 417, is covered by an insulating second polyacetylene film 421. By selectively converting part of the polyacetylene film 421 that directly covers the aluminum wiring 417 so as to be electrically conductive, a second contact plug 421a is formed. Because a second aluminum wire 427 which is provided on the surface of the polyacetylene film 421 directly covers the upper end of the contact plug 421a, an electrical connection is made to the aluminum wire 417.

In the above-noted second prior art example, the contact plugs 411a and 421a, which are formed by conversion of prescribed regions of the insulating polyacetylene films 411 and 421 so as to be conductive, each function as a wiring layer that serves as a contact plug but it does not serve as a wiring layer.

Although the upper surface of the polyacetylene film 411, including the upper surface of the contact plug 411a, while not being flat, is smooth and does not have a step, a problem related to the ability to cover a step in the first aluminum wire 417 is avoided.

Although there exists a step because of the first aluminum wire 417, because of the method of manufacturing, there is no problem occurring related to the ability to cover a step in the second polyacetylene film 421 which covers the first polyacetylene film 411, including these aluminum wires 417.

Also, because the surface of the polyacetylene film 421 as well, including the second contact plug 421a is also not flat, but rather is smooth and does not have a step, in the same manner as the first aluminum wiring 417, a problem related to the ability to cover a step in the second aluminum wiring 427 is also avoided.

In the above-described first prior art example, the first and second prescribed regions of the insulating first and third polyacetylene films are selectively converted so as to be electrically conductive, thereby forming the first and second electrically conductive wiring layers. However, the insulating second polyacetylene film (which is provided between the insulating first and third polyacetylene films) and which serves as an interlayer insulating film between the first and second wiring layers does not have a via hole or the like provided in it for the purpose of connection to these first and second wiring layers.

In a structure such as this, because the first wiring layer and the second polyacetylene film are made of the same material, it is difficult to form a via hole in the second polyacetylene film which reaches the first wiring layer without causing a problem with respect to the first wiring layer (this being the first problem with the first prior art example).

Additionally, in forming a second wiring layer by selectively doping a second prescribed region of the third polyacetylene film with an impurity, because the second (and first) polyacetylene film does not act as a stopper for this impurity used in the doping process, it is difficult to form the second wiring layer in a manner that is stopped inside the third polyacetylene film (this being the second problem with the first prior art example).

In the above-noted second prior art example, the insulating first and second polyacetylene film each function as interlayer insulation films, prescribed regions of these polyacetylene films being selectively converted so as to be electrically conductive, thereby forming the first and second contact plugs.

Because of this, the above-noted first problem in the first prior art example, related to connection between the upper wiring layer and the lower wiring layer, is solved. Additionally, in the second prior art example, when for example the second prescribed region of the second polyacetylene film is selectively doped with an impurity, because the first aluminum wiring functions are a stopper, the above-noted second problem in the first prior art example is also solved.

However, in the above-noted second prior art example, if for example a prescribed region of the insulating second polyacetylene film is selectively converted so as to be electrically conductive, thereby forming a wiring layer, a problem similar to the above-noted second problem of the first prior art example arises, so that while it is possible to form a contact plug in the second polyacetylene film of the second prior art example, the formation of a wiring layer is difficult. Additionally, in the second prior art example, although the upper surface of the second polyacetylene film, which covers the first aluminum wiring is smooth, it has unevenness and is not flat.

Because of this, no problem arises with coverage at the time of formation of the aluminum film for the purpose of forming the second aluminum wiring layer.

However, in the photolithography process for forming the second aluminum wiring layer, a problem arises with regard to depth of focus that is attributable to the unevenness of the upper surface of this second polyacetylene film, so that it is not easy for patterning the second aluminum wiring. That is, the second prior art example does not take sufficient advantage of the benefit of the polyacetylene film.

In view of the above-described problems occurring in the prior art, an object of the present invention is to provide multilayer wiring formed of flat laminations by sufficiently exploiting the advantage of a polyacetylene film, and a manufacturing method therefor.

SUMMARY OF THE INVENTION

The first embodiment of a semiconductor device according to the present invention has a lower wiring level that is provided on the surface or above the surface of a semiconductor substrate, this lower wiring layer being covered by a first interlayer insulating film that has a flattened upper surface.

This first interlayer insulating film is provided with contact holes that extend to the lower wiring layer, these contact holes being filled by contact plugs that are formed so as to include a metallic material. The upper surface of the above-noted first interlayer insulating film is entirely covered by a first insulating polyacetylene film, and a first prescribed region of the first polyacetylene film which minimally includes the top edge of above-noted contact plug is provided with a first upper wiring layer which is formed by selective conversion of the first polyacetylene film so as to be electrically conductive, the entire of above-noted first polyacetylene film, including the above-noted first upper wiring layer, being covered by a second interlayer insulating film which is formed as a laminated film that minimally includes a non-organic insulating film and a polyimide film.

This second interlayer insulating film is provided with a via hole that extends to the above-noted first upper wiring layer, the upper surface of this second interlayer insulating film minimally being entirely covered by a second insulating polyacetylene film, and a second prescribed region of the second polyacetylene film which minimally includes the above-noted via hole is provided with a second upper wiring layer by selective conversion of the second polyacetylene film so as to make it electrically conductive.

The above-noted via hole is preferably filled by a second contact plug which is formed by an electrically conductive third polyacetylene film.

More preferably, the above-noted second polyacetylene film which includes the above-noted second upper wiring layer has its surface covered by a surface protective film, this surface protective film being provided with apertures, these apertures being provided with metallic bumps, and the above-noted surface protective film being made of at least one material selected from the group consisting of a silicon oxide film, silicon nitride film, and polyimide film.

The second embodiment of a semiconductor device according to the present invention has a lower wiring layer that is provided on the surface or above the surface of a semiconductor substrate, this lower wiring layer being covered by a first interlayer insulating film that has a flattened upper surface.

This first interlayer insulating film is provided with contact holes that extend to the lower wiring layer, these contact holes being filled by contact plugs that are formed so as to include a metallic material.

The upper surface of the above-noted first interlayer insulating film is entirely covered by a first insulating polyacetylene film, and a first prescribed region of the first polyacetylene film which minimally includes the top edge of above-noted contact plug is provided with a first upper wiring layer which is formed by selective conversion of the first polyacetylene film so as to be electrically conductive, the entire of above-noted first polyacetylene film, including the above-noted first upper wiring layer, being covered by a second interlayer insulating film which is formed from at least one of the group consisting of a silicon oxide film and a silicon nitride film.

This second interlayer insulating film is provided with a via hole that extends to the above-noted first upper wiring layer, the upper surface of this second interlayer insulating film minimally being entirely covered by a second insulating polyacetylene film, and a second prescribed region of the second polyacetylene film which minimally includes the above-noted through hole is provided with a second upper wiring layer by selective conversion of the second polyacetylene film so as to make it electrically conductive.

The above-noted via hole is preferably filled by a second contact plug which is formed by an electrically conductive third polyacetylene film. More preferably, the above-noted second polyacetylene film which includes the above-noted second upper wiring layer has its surface covered by a surface protective film, this surface protective film being provided with apertures, these apertures being provided with metallic bumps, and the above-noted surface protective film being made of at least one material selected from the group consisting of a silicon oxide film, silicon nitride film, and polyimide film.

The first embodiment of a semiconductor device manufacturing method according to the present invention has a step whereby a first interlayer insulating film made from a silicon insulating film covers a lower wiring layer that is provided on the surface or above the surface of a semiconductor substrate, the upper surface of the first interlayer insulating film being flattened, contact holes being provided on this first interlayer insulating film which extends to said lower wiring layer, etch-back being performed to successively form a barrier conductive film and a metallic layer over the entire surface thereof, contact plugs being formed in these contact holes, a step whereby a first polyacetylene insulating film is formed over the entire surface, the surface of the first insulating polyacetylene film being converted by oxygen plasma processing so as to make it hydrophilic, a first non-organic insulating film being formed over the entire surface thereof, a step whereby the surface of the above-noted non-organic insulating film has formed onto it a first photoresist film having an aperture part in a first prescribed region, ion implantation of an impurity using this first photoresist film as a mask being used to convert a first prescribed region of the first polyacetylene film to be electrically conductive, thereby forming a first upper wiring layer, a step whereby ashing by means of oxygen plasma is used to remove the above-noted fist photoresist film, and further whereby the above-noted first non-organic insulating film is selectively removed, a step whereby, over the entire surface, a second non-organic insulating film, a polyimide film, and a third non-organic insulating film are successively formed, a step whereby anisotropic etching is performed with respect to the above-noted third non-organic insulating film, using the second photoresist film as a mask, whereby RIE by oxygen gas is used to perform anisotropic etching of the above-noted polyimide film, the second photoresist film being removed, and whereby anisotropic etching of minimally the exposed part of the second non-organic insulating film is used to selectively remove it, thereby forming a via hole which reaches the above-noted first upper wiring layer, a step whereby a second insulating polyacetylene film is formed over the entire surface, this second polyacetylene film being etched back by RIE using oxygen gas, thereby leaving second polyacetylene films only inside the above-noted via holes, these second polyacetylene films being converted so as to be electrically conductive, thereby forming second contact plugs that are formed by these second polyacetylene films, a step whereby the entire surface has formed on it a third polyacetylene film, and a step whereby a second prescribed region of the above-noted third polyacetylene film is selectively converted so as to be electrically conductive, this forming the second upper wiring layer.

The above-noted first and second or third non-organic insulating film is preferably a silicon oxide film or silicon nitride film formed by an ECR-PECVD process, the above-noted second polyacetylene film being formed by polymerization of acetylene using a Ziegler-Natta catalyst, and the conversion of the second polyacetylene film to electrical conductivity being made by gas-phase or liquid-phase diffusion. More preferably, there is a further step whereby a surface protective film is formed that covers the upper surface of the above-noted third polyacetylene film, including the above-noted second upper wiring surface, and whereby apertures are formed in this surface protective film, these apertures being provided with metal bumps.

The second embodiment of a semiconductor device manufacturing method according to the present invention has a step whereby a first interlayer insulating film made from a silicon insulating film covers a lower wiring layer that is provided on the surface or above the surface of a semiconductor substrate, the upper surface of the first interlayer insulating film being flattened, contact holes being provided on this first interlayer insulating film which extends to the lower wiring layer, etch-back being performed to successively form a barrier conductive film and a metallic layer over the entire surface thereof, contact plugs being formed in these contact holes, a step whereby a first polyacetylene insulating film is formed over the entire surface, the surface of this first insulating polyacetylene film being converted by oxygen plasma processing so as to make it hydrophilic, a first non-organic insulating film being formed over the entire surface thereof, a step whereby the surface of the above-noted non-organic insulating film has formed onto it a first photoresist film having an aperture part in a first prescribed region, ion implantation of an impurity using this first photoresist film as a mask being used to convert a first prescribed region of the first polyacetylene film to be electrically conductive, thereby forming a first upper wiring layer, a step whereby ashing by means of oxygen plasma is used to remove the above-noted fist photoresist film, and further whereby the above-noted first non-organic insulating film is selectively removed, a step whereby, over the entire surface, a second interlayer insulating film is formed from a second non-organic insulating film, a step whereby anisotropic etching is performed with respect to the above-noted second interlayer insulating film using a second photoresist film as a mask, via holes being formed which reach the above-noted first upper wiring layer, and further this second photoresist film is removed by using an organic solvent, and a step whereby a second insulating polyacetylene film is formed over the entire surface, a second prescribed region of this second insulating polyacetylene film being converted so as to be electrically conductive, thereby forming the second upper wiring layer.

The above-noted first non-organic insulating film is preferably a silicon oxide film or silicon nitride film formed by an ECR-PECVD process. The above-noted second non-organic insulating film either includes at least one of a silicon oxide film and silicon nitride film formed by an ECR-PECVD process or is formed by an LPD process.

More preferably, there is a further step whereby a surface protective film is formed that covers the upper surface of the above-noted second polyacetylene film, including the above-noted second upper wiring surface, and whereby apertures are formed in this surface protective film, these apertures being provided with metal bumps.

DETAILED DESCRIPTION OF THE PREFERRED EMBODIMENTS

Embodiments of present invention are described below, with reference being made to the relevant accompanying drawings.

Figure 1:
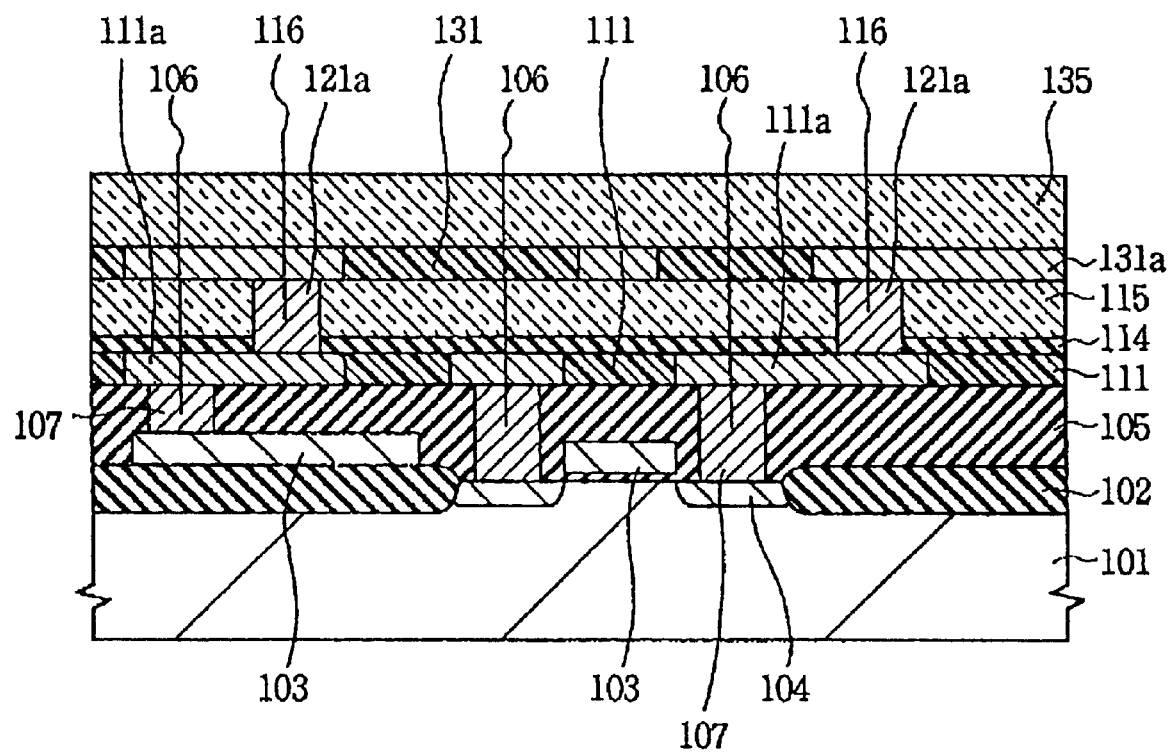
FIG. 1 is a schematic cross-sectional view which shows an example of the first embodiment of the present invention.

Referring to FIG. 1, we see a schematic cross-sectional view of a semiconductor device, this being a semiconductor device according to the first embodiment of the present invention, which has multilayer wiring that includes a two-layer polyacetylene film.

On the device isolation region of a P-type silicon substrate 101 is provided a field oxide layer 102 having a film thickness of approximately 300 nm, and on the device region of the P-type silicon substrate 101 is provided a gate electrode 103 having a film thickness of approximately 200 nm, with an intervening gate oxide film (not shown in the drawing) having a film thickness of approximately 10 nm.

An $N^+$ type diffusion layer 104, which serves as the source-drain region being provided in the device region which is self-aligned to the field oxide film 102 and the gate electrode 103, of the surface of the P-type silicon substrate 101.

The junction depth and line width of the n-type diffusion layer 104 are 0.15 $\mu$m and 0.45 $\mu$m, respectively. An n-channel MOS transistor which is provided on the surface of the P-type silicon substrate 101, including the field oxide film 102 and the gate electrode 103 is covered by a first interlayer insulating film 105 made of, for example, a silicon oxide film.

The upper surface of this interlayer insulating film 105 is flattened by means of chemical mechanical polishing (CMP) or the like, the thickness of the interlayer insulating film 105 on the surface of the field oxide film 102 being approximately 600 nm.

The lower wiring layer in this example of the first embodiment includes the gate electrode 103 and the $N^+$ type diffusion layer 104. The interlayer insulating film 105 is provided with a contact hole 106 having a diameter of approximately 0.35 $\mu$m and which reaches the lower wiring layer of the gate electrode 103 and the $N^+$ type diffusion layer 104 and the like.

The contact hole 106 is filled with a contact plug 107 that is formed, for example, by a laminate of a titanium film, a titanium nitride film and a tungsten film.

The upper surface of the interlayer insulating film 105, including the upper edge of the contact plug 107, is covered by an insulating polyacetylene film 111. The film thickness of this polyacetylene film 111 is approximately 500 nm. a first prescribed region of the polyacetylene film 111, including at least the contact plug 107, is selectively converted so as to be electrically conductive, thereby forming a first upper wiring layer 111a.

The line width and spacing of the upper wiring layer 111a are approximately 0.45 $\mu$m and 0.4 $\mu$m, respectively. The upper wiring layer 111a electrically connects to a lower wiring layer including the gate electrode 103 and the $N^+$ type diffusion layer 104 and the like. The upper surface of the polyacetylene 111 and the upper surface of the upper wiring layer 111a are continuous, flat surfaces.

The upper surface of the polyacetylene film 111 which includes the upper surface of the upper wiring layer 111a is covered with a second interlayer insulating film which is formed by lamination of, for example, a (non-organic) silicon oxide film 114 having a film thickness of approximately 50 nm and an organic film, this being for example a polyimide film 115 having a film thickness of approximately 1.0 $\mu$m.

The upper surface of the polyimide film 115 is flat, reflecting the shape of the upper surface of the polyacetylene film 111 which includes the upper wiring layer 111a. The second interlayer insulating film is provided with a via hole that reaches the upper wiring layer 111a. The diameter of the via hole 116 in this embodiment is approximately 0.35 $\mu$m.

The via hole 116 has a high aspect ratio, and is filled with a second contact plug 121a that is made from a polyacetylene film that is converted so as to be electrically conductive. The upper surface of the polyimide film 115, including the upper edge of the contact plug 121a, is covered by an insulating polyacetylene film 131. The film thickness of the polyacetylene film 131 is, for example, approximately 500 nm.

A second prescribed region of the polyacetylene film 131a which minimally includes the upper edge of the contact plug 121a is selectively converted so as to be electrically conductive, thereby forming the second upper wiring layer 131a. The line width and spacing of the second upper wiring layer 131a are approximately 0.45 µm and 0.4 µm, respectively.

The upper wiring layer 131a is electrically connected to the upper wiring layer 111a, via the contact plug 121a. The upper surface of the polyacetylene film 131 and the upper surface of the upper wiring layer 131a are continuous and flat surfaces.

The upper surface of the polyacetylene film 131 which includes the upper surface of the upper wiring layer 131a is covered with a surface protective film made of a polyimide film 135 having a film thickness of approximately 1.0 µm.

Figure 2:
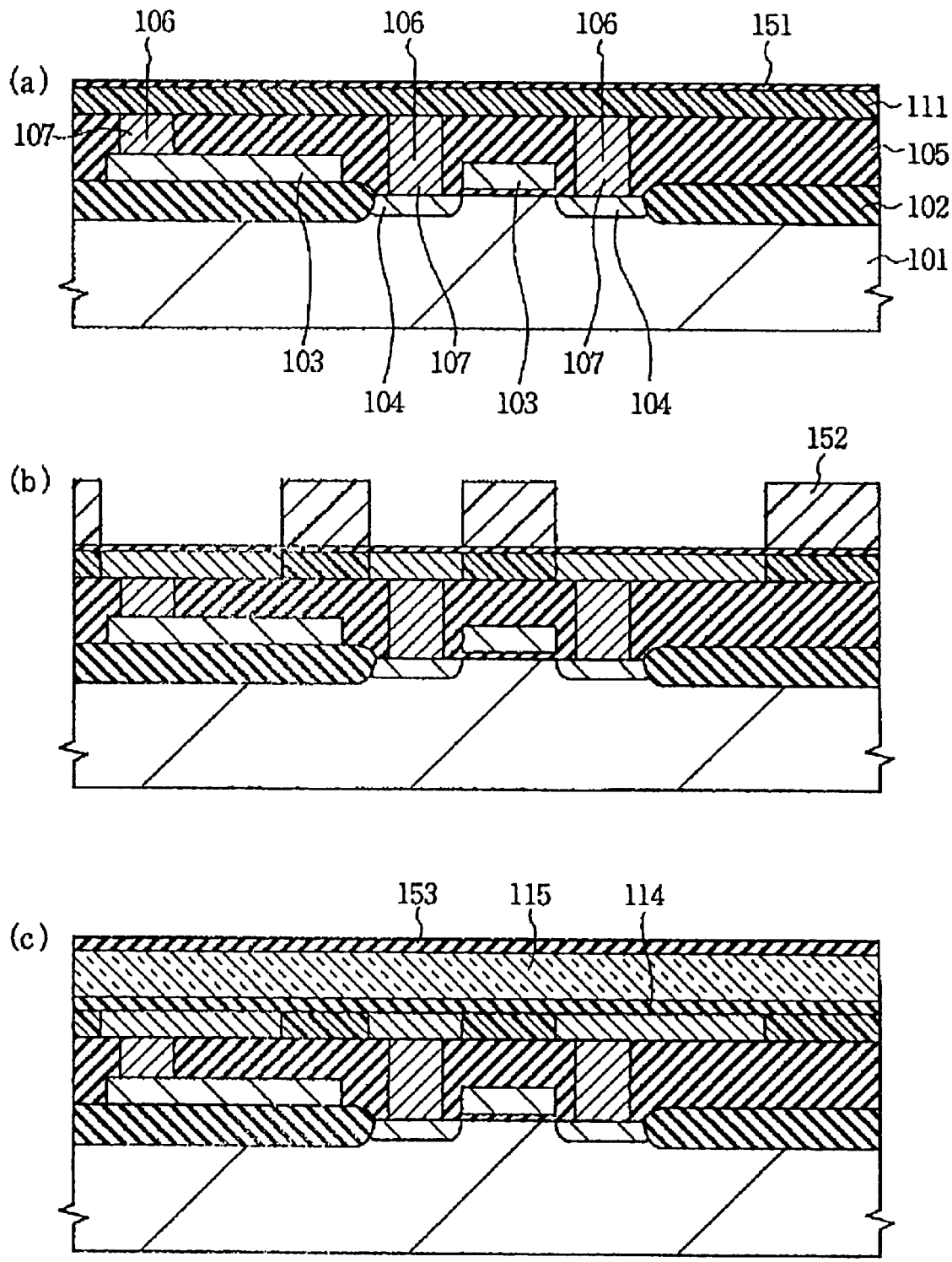
FIGS. 2A–C is a schematic cross-sectional views of an example of the manufacturing process in the above-noted first embodiment of the present invention.
Figure 3:
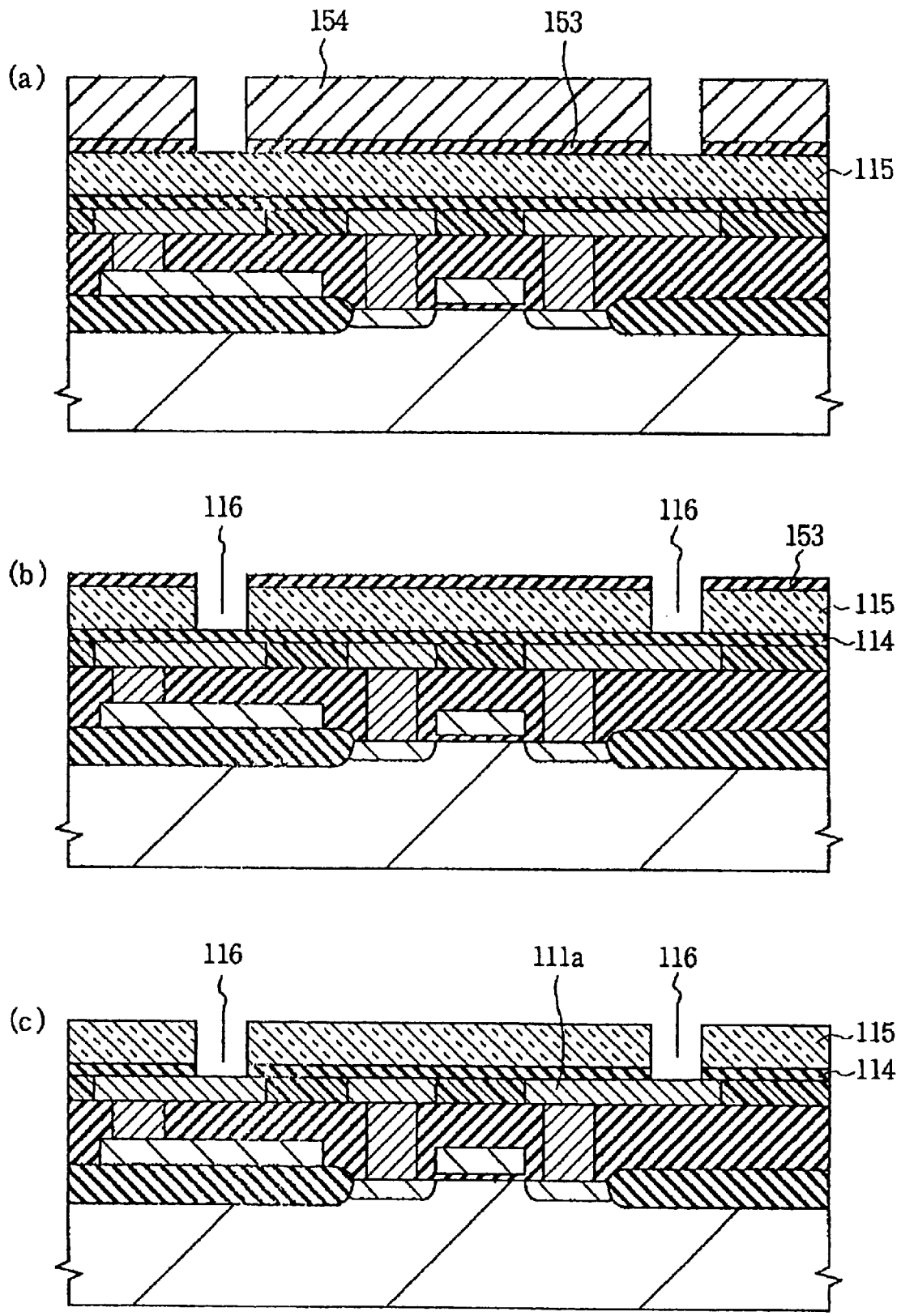
FIGS. 3A–C is a schematic cross-sectional views of an example of the manufacturing process in the above-noted first embodiment of the present invention.
Figure 4:
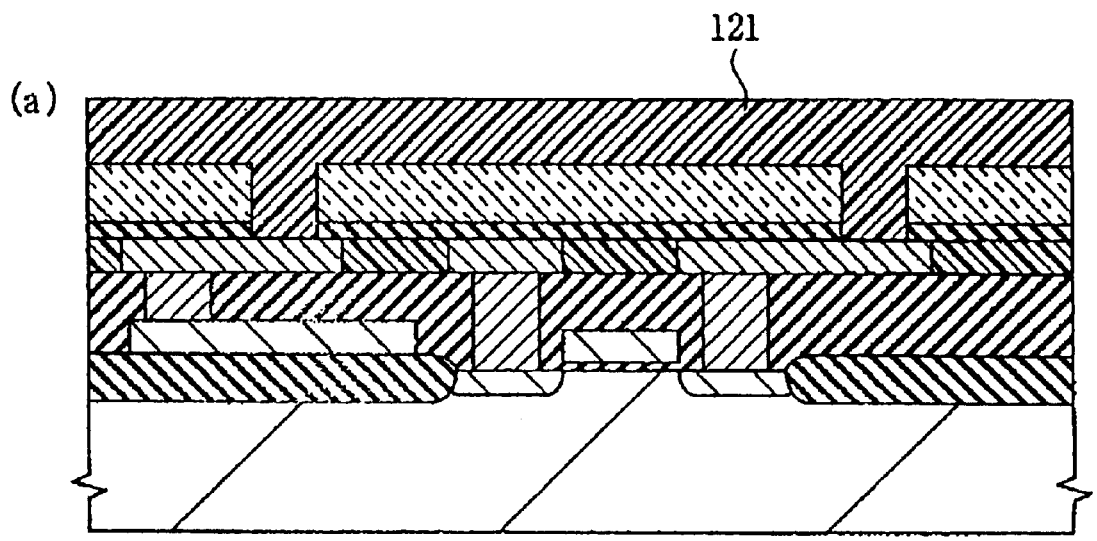
FIGS. 4A–C is a schematic cross-sectional views of an example of the manufacturing process in the above-noted first embodiment of the present invention.
Figure 4:
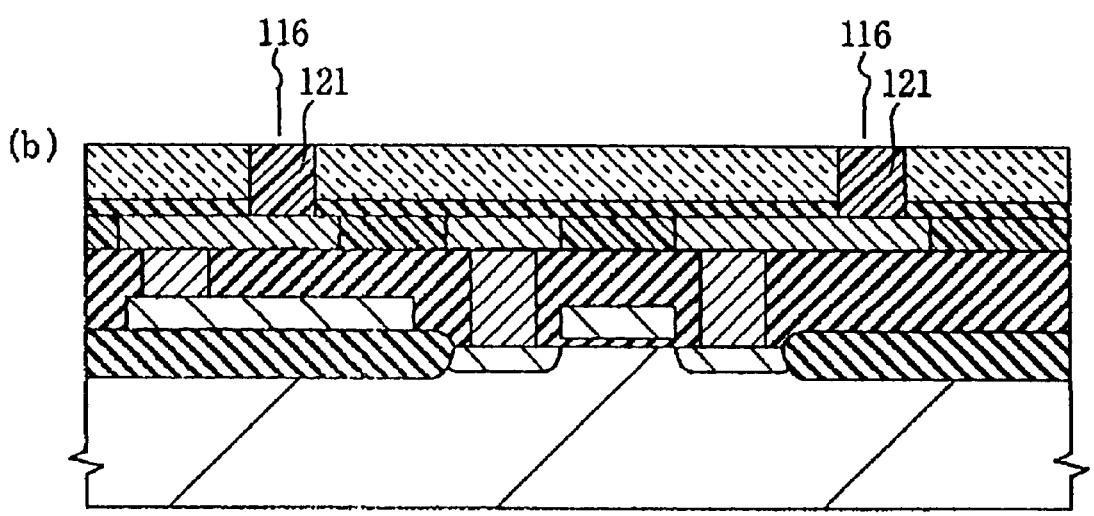
Figure 4:
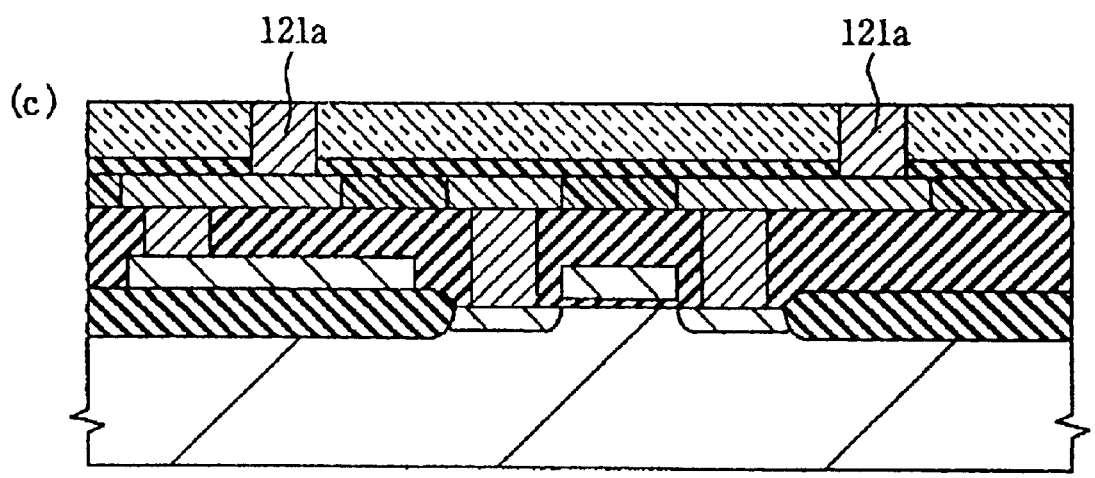

Referring to FIG. 2, FIG. 3 and FIG. 4, which show schematic cross-sectional views of the manufacturing process for a semiconductor device, along with FIG. 1, a semiconductor device of the first example of the first embodiment of the present invention is formed as follows.

First, on a device isolation region of the surface of the P-type silicon substrate 101, a field oxide film 102 is formed by, for example, the method of selective oxidation. After a gate oxide film (not shown in the drawing) is formed by thermal oxidation on the device region of the P-type silicon substrate 101, the gate electrode 103 is formed. Ion implantation is done, using the field oxide film 102 and the gate electrode 103 as a mask, thereby forming an $N^+$ type diffusion layer 104, which will serve as the source-drain region, on the device region of the surface of the P-type silicon substrate.

Over the surface of an n-channel MOS transistor provided on the surface of the P-type silicon substrate 101, which includes the field oxide film 102 and the gate electrode 103, a silicon oxide film is formed by CVD method with using as raw material, for example, TEOS and ozone (O3), the upper surface of this silicon oxide film being then flattened by, for example, CMP, thereby forming a first interlayer insulating film 105.

The interlayer insulating film 105 has formed on it a contact hole 106 that reaches the lower wiring layer of, for example, the gate electrode 103 and the $N^+$ type diffusion layer 104. For example, using sputtering a film of titanium, using reactive sputtering a film of titanium nitride, and using hydrogen reduction a tungsten film are successively formed over the entire surface, these laminated film layers are etched back to form a contact plug 107 that fills the contact hole 106.

The reason for forming a contact plug 107 from such materials is that, when selectively doping impurities into the first prescribed region of the first polyacetylene insulating film in a later process, it is necessary for the contact plug 107 to serve as a doping stopper. Therefore, the contact plug 107 is preferably formed from a polycrystalline silicon film or the like.

Next, by plasma polymerization of acetylene for example, a first polyacetylene insulating film 111 is formed over the entire surface to a film thickness of which being approximately 500 nm. The conditions for forming this film are as follows.

The flow of argon (Ar) which is the carrier gas is several sccm, the flow of acetylene which is the polymerizing monomer gas is several sccm, the high frequency discharge output is 10 W at 10 MHz, and the pressure is 7 to 40 Pa.

The speed of growth of the polyacetylene film 111 under these conditions is 30 to 90 nm/minute. The method of forming the polyacetylene film 111 is not limited to the above-noted plasma polymerization, and can also be by means of an acetylene polymer reaction, making use of a Ziegler-Natta catalyst. Next, under conditions of a pressure of 130 Pa, an oxygen ($O_2$) flow of 300 sccm, an RF power of 100 W, and a temperature of 25° C., oxygen plasma processing is performed of the surface of the polyacetylene film 111. By doing this, the surface of the polyacetylene film 111 changes from hydrophobic to hydrophilic. The purpose of performing this processing is to increase the affinity of the first non-organic insulating film with respect to the polyacetylene film in the next process step.

Next, a silicon oxide film 151 of a film thickness of, for example, approximately 10 nm, is formed as the first non-organic insulating film over the entire surface by the ECR-PECVD process.

The film formation conditions for forming the silicon oxide film 151 are, for example, a pressure of 0.7 Pa, a TEOS flow of 2 sccm, an oxygen flow of 10 sccm, microwave power of 80 W, a magnetic field of 875 Gauss, and a temperature of 25° C.

The purpose of forming the silicon oxide film 151 is to be able to remove the first photoresist layer, which is formed in the next process step, without any hindrances (FIG. 2 (a)). In this example of the first embodiment of the present invention, the first non-organic insulating film is not limited to being a silicon oxide film, and it can also be, for example, a silicon nitride film or the like, formed by the ECR-PECVD process.

The conditions for forming a silicon nitride film by the ECR-PECVD process are a pressure of 1.7 to 2.1 Pa, a monosilane flow of ($SiH_4$) flow of 50 sccm, a nitrogen ($N_2$) flow of 75 sccm, an argon (Ar) flow of 70 sccm, a microwave power of 2 kW, an RF power of 1.4 kW, and a temperature of 80° C.

Under these conditions, the speed of growth of the film is approximately 100 nm/minute. However, the first non-organic insulating film, from the standing of maintaining the characteristics of the polyacetylene film 111, the temperature used in formation, including the film formation temperature is preferably lower than 350° C.

Next, a first photoresist film 152 having an aperture in a first prescribed region of the polyacetylene film 111 that minimally includes the contact hole 107, is formed over the surface of the silicon oxide film 151. Ion implantation of $AsF_5$, $I_2$ or the like is done with the photoresist film 152 as a mask, a first prescribed region of the polyacetylene film 111 being converted so as to be electrically conductive, thereby forming the first upper wiring layer 111a which is formed from a polyacetylene film. The conditions for this ion implantation are an implantation potential of 30 to 200 keV and a dose in the order of $10^{18}$ cm$^{-2}$ (FIG. 2 (b)). In doing this, if the dose is $10^{15}$ cm$^{-2}$ to $10^{16}$ cm$^{-2}$ the electrical conductivity of the first prescribed region of the polyacetylene film will only rise to that of a semiconductor.

Next, by ashing with oxygen plasma, the photoresist film 152 is removed. Because the photoresist film 152 is doped with a high dose of impurity, it is not possible to remove it by peeling with the usual organic solvent. The ashing conditions are more severe than the conditions for the above-noted oxygen plasma processing, these being, for example, a pressure of 130 Pa, an oxygen ($O_2$) flow of 500 sccm, an RF power of 1 kW, and a temperature of 120° C.

Unless the above-noted silicon oxide film 151 is provided, this ashing will cause etching of the polyacetylene film 111 and the upper wiring layer 111a as well.

Also, because part of the silicon oxide layer 151 is doped with a high dose of impurity, it is preferable that this silicon oxide film 151 be removed by, for example buffered hydrofluoric acid.

Next, a silicon oxide film 114 of a film thickness of approximately 50 nm is formed over the entire surface by the ECR-PECVD process, this forming the second non-organic insulating film. By using the spin on coating and thermal oxidation at approximately 300° C., a polyimide film 115 is formed over the entire surface, having a film thickness of approximately 1.0 μm.

A silicon oxide film 153 is formed by the ECR-PECVD process over the entire surface to a film thickness of approximately 50 nm, this forming the third non-organic insulating film.

Additionally, the thickness of the silicon oxide film 153 may be formed thicker than that of the silicon oxide film 114, and it is noted that the second and third non-organic insulating films are not limited to each being silicon oxide films.

Next, a second photoresist film 154 is formed over the surface of the silicon oxide film 153. By performing anisotropic etching with this photoresist film 154 as a mask, the silicon oxide film 153 is selectively etched (FIG. 3 (a)).

Then, by means of RIE using oxygen as an etching gas, the polyimide film 115 is anisotropically etched, a through hole 116 having a diameter of approximately 0.35 μm being thereby formed (although, strictly speaking, the via hole is incomplete at this stage).

By means of this RIE, the photoresist film 154 that covers the surface of the remaining silicon oxide film 153 is removed. The silicon oxide film 153 and the silicon oxide film 114 serve as protective films, respectively, of the polyimide film 115 and the upper wiring layer 111a (polyacetylene film 111) at the time for formation of the through hole (FIG. 3 (b)).

Next, to remove the silicon oxide film 114 at the bottom of the via hole 116, anisotropic etching is done with respect to the silicon oxide film. By doing this, the through hole 116 reaches the first upper wiring layer 111a (strictly speaker it is a this point that the via hole is actually formed), simultaneously with which the silicon oxide film 153 which had covered the polyimide film 115 is also removed (FIG. 3 (c)).

Next, by means of polymerization reaction of acetylene using a Ziegler-Natta catalyst, a second polyacetylene film 121 is formed over the entire surface to a film thickness of approximately 40 nm. The reason such a method is used in the forming of the polyacetylene film 121 is because of the high aspect ratio of the via hole 116 (approximately 3.0) (FIG. 4 (a)).

Then, oxygen gas is used to perform RIE etching back of the polyacetylene film 121 until the upper surface of the polyimide film 115 is exposed, leaving the polyacetylene film 121 only inside the via hole 116. This etching back makes it easy to achieve an upper surface of the polyacetylene film that remains inside the via hole 116 that is continuous with the upper surface of the polyimide film 115 and flat (FIG. 4 (b)). If (rather than the silicon oxide film 153) the third non-organic insulating film is formed from a silicon oxide film or silicon nitride film of a thickness that is sufficiently thicker than the silicon oxide film 153, the etching back thereof is further facilitated.

Next, gas-phase or liquid-phase diffusion is used to convert the polyacetylene film 121 so as to be electrically conductive or, stated in other terms, the polyacetylene film 121 which fills the via hole 116 is selectively doped, thus forming a second contact plug 121a which fills the via hole 116 (FIG. 4 (c)). The reason this type of doping method is used is as follows.

Because the thickness (height) of the polyacetylene film 121 which fills the via hole 116 is approximately 1.0 μm, performing doping of the polyacetylene film 121 by ion implantation immediately after forming the film requires an extremely high implantation potential. Additionally, if ion implantation is performed at the stage at which the polyacetylene film 121 is left only inside the via hole 116, an undesirable doping by a high does of impurities will occur even within the polyimide film 115.

Furthermore, in the case in which the third non-organic insulating film (rather than the silicon oxide film 153) is a silicon oxide film or silicon nitride film which has a thickness that is sufficiently thicker than the silicon oxide film 153, the upper surface of the polyimide film 115 will be covered by the third non-organic insulating film, which is more preferable from the standpoint of doping.

Next, a third polyacetylene film 131 having a film thickness of approximately 500 nm is formed over the entire surface. A second prescribed region of this polyacetylene film 131 which minimally includes a part which makes direct contact with the contact plug 121a is selectively doped with an impurity, converting these regions to electrically conductive, thereby forming the second upper wiring layer 131a. The method of forming this upper wiring layer 131a can also be the same as the method of forming the above-described first upper wiring layer 111a.

Direct writing with a focused ion beam (FIB) can be used to dope with an impurity. Additionally, a fourth non-organic insulating film which covers the third polyacetylene film 131 is formed, this being patterned, the patterned fourth non-organic insulating film being used as a hard mask for gas-phase or liquid-phase diffusion to form the above-noted second upper wiring layer. In the first embodiment, it is also possible to use the above-noted direct writing by means of FIB and gas-phase or liquid-phase diffusion using a hard mask to form the above-noted first upper wiring layer.

In this example of the embodiment of the present invention, if the second interlayer insulating film, which is made up of the silicon oxide film 114 and the polyimide film 115, is thin, steps of forming the above-described second non-organic polyacetylene film, leaving this second polyacetylene film inside the via hole, and doping the thus-remaining second polyacetylene film can be omitted.

Next, a polyimide film 135 having a film thickness of approximately 1.0 μm which is a surface protective film that covers the surface of the polyacetylene film 131 that includes the upper wiring layer 131a is formed.

Wet etching with hydrazine or the like is done with a photoresist film (not shown in the drawing) as a mask to selectively remove the polyimide film 135, thereby forming a bonding pad (not shown in the drawing) of approximately 100 μm.

Because the bonding pad is very large compared to the above-noted via hole 116, there is actually no need to use RIE by oxygen gas to form these bonding pads.

By forming a palladium film (not shown in the drawing), for example, over the entire surface by means of sputtering, the above-noted photoresist film can be peeled off by using an organic solvent. Non-electrolytic plating of gold is performed, thereby forming a metal bump (not shown in the drawing) on the bonding pads (FIG. 1).

Because of the high immunity of the polyacetylene film with respect to chemicals, the formation of the bonding pads is done by the above-described wet etching, and in the case in which the above-noted photoresist film is peeled off by using an organic solvent, there is no need to have a non-organic insulating film between the polyacetylene film 131 (and upper wiring layer 131a) and the polyimide film 135.

As described above, according to this example of the first embodiment of the present invention, because the selective doping with an impurity of a prescribed region of an insulating polyacetylene film is done without hindrance, the formation of wiring, including the formation of the contact plugs formed by the doped polyacetylene films, is facilitated.

Additionally, because the second interlayer insulating film between the first polyacetylene film 111 which includes the first upper wiring layer 111a and the third polyacetylene film 131 which includes the second upper wiring layer 131a is formed as a lamination of the silicon oxide film 114 and the polyimide film 115, it is possible to form the second upper wiring layer 131a without causing a problem with regard to the first upper wiring layer 111a.

Also, it is easy to make an electrical connection between the second upper wiring layer 131a and the first upper wiring layer 111a via the via hole 116 provided in the second interlayer insulating film and the second contact plug 121a.

Additionally, according to this example of the first embodiment of the present invention, because the first polyacetylene film 111 which includes the first upper wiring layer 111a is a flat film, the second interlayer insulating film which is formed by a lamination of the polyimide film 115 onto the silicon oxide film 114 is a flat film, this being reflected in the third polyacetylene film 131 which includes the second upper wiring layer 131a also being a flat film.

For this reason, when forming the second upper wiring layer 131a, for example, problems with depth or field and the like caused by unevenness of the upper surface of the base are avoided, thereby facilitating the formation of the second upper wiring layer, for example.

Furthermore, while in this example of the first embodiment of the present invention the lower wiring layer is an N$^+$ diffusion layer and gate electrode of an n-channel MOS transistor formed on the surface of a P-type silicon substrate, the first embodiment of the present invention imposed no such limitation with regard to either the substrate or the semiconductor device. Additionally, this example of the first embodiment of the present invention does not imposed limitations with regard to specific values presented by way of explanation of the embodiment herein.

Figure 5:
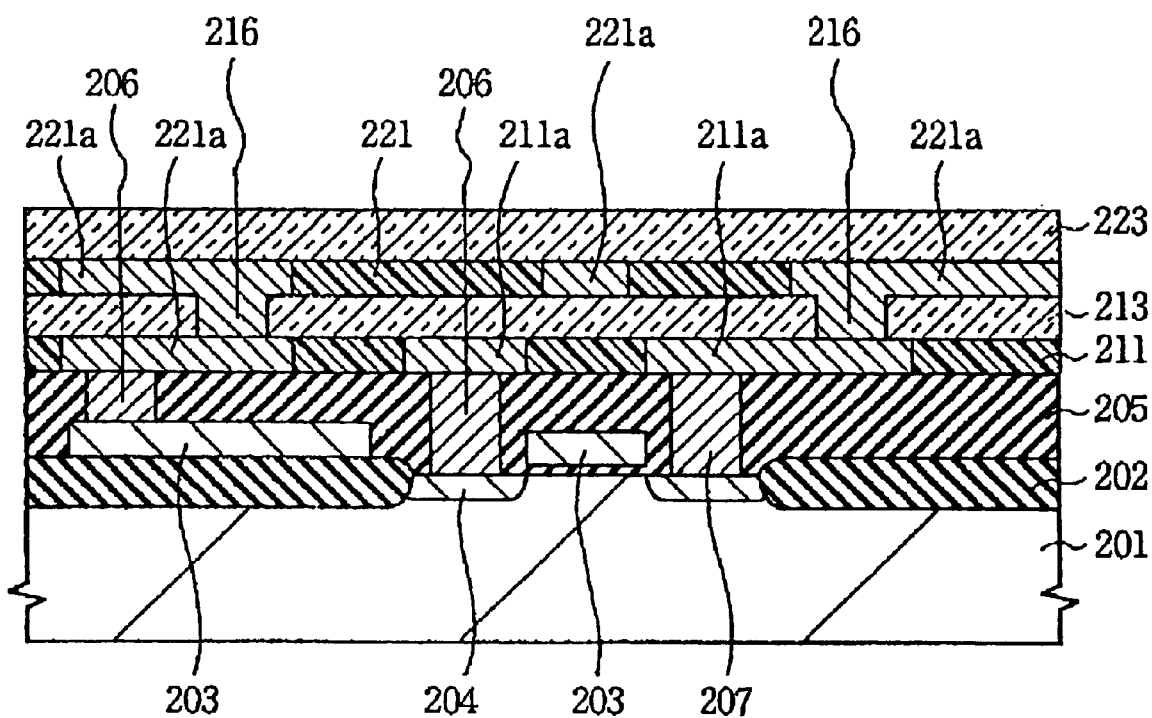
FIG. 5 is a schematic cross-sectional view of the second embodiment of the present invention.

Referring to FIG. 5, which is a schematic cross-sectional view of a semiconductor device, the second embodiment of the present invention also has multilayer wiring that includes a two-layer polyacetylene film. The difference in this example of the second embodiment of the present invention is with respect to the example given of the first embodiment of the present invention is that the second interlayer insulating film is made of a silicon oxide film, and that the second upper wiring layer is formed on the second polyacetylene film.

On the device isolation region of a P-type silicon substrate 201, is provided a field oxide film 202 having a film thickness of approximately 300 nm, and on the device region of the P-type silicon substrate 201 is provided a gate electrode 203 having a film thickness of approximately 200 nm, with an intervening gate oxide film (not shown in the drawing) having a film thickness of approximately 10 nm.

An N$^+$ type diffusion layer 204, being provided in the device region which is self-aligned to the field oxide film 202 and the gate electrode 203, of the surface of the P-type silicon substrate 201.

The junction depth and line width of the n-type diffusion layer 204 are 0.15 $\mu$m and 0.45 $\mu$m, respectively.

An N-channel MOS transistor which is provided on the surface of the P-type silicon substrate 201, including the field oxide film 202 and the gate electrode 203 is covered by a first interlayer insulating film 205 made of, for example, a silicon oxide film.

The upper surface of this interlayer insulating film 205 is flattened by means of chemical mechanical polishing (CMP) or the like, the thickness of the interlayer insulating film 205 on the surface of the field oxide film 202 being approximately 600 nm.

The lower wiring layer in this example of this second embodiment includes the gate electrode 203 and the N$^+$ type diffusion layer 204. The interlayer insulating film 205 is provided with a contact hole 206 having a diameter of approximately 0.35 $\mu$m and which reaches the lower wiring layer of the gate electrode 203 and the N$^+$ type diffusion layer 104 and the like. The contact hole 206 is filled with a contact plug that includes a metallic material.

The upper surface of the interlayer insulating film 205, including the upper edge of the contact plug 207, is covered by an insulating polyacetylene film 211. The film thickness of this polyacetylene film 211 is approximately 500 nm. a first prescribed region of the polyacetylene film 211, including at least the upper end of the contact plug 207, is selectively converted so as to be electrically conductive, thereby forming a first upper wiring layer 211a.

The line width and spacing of the upper wiring layer 211a are approximately 0.45 $\mu$m and 0.4 $\mu$m, respectively. The upper wiring layer 211a electrically connects the gate electrode 203 and the N$^+$ type diffusion layer 204 and the like to a lower wiring layer. The upper surface of the polyacetylene 211 and the upper surface of the upper wiring layer 211a are continuous, flat surfaces.

The upper surface of the polyacetylene film 211 which includes the upper surface of the upper wiring layer 211a is covered with a second interlayer insulating film which is formed by a silicon oxide film 213 having a film thickness of approximately 600 nm, for example. The upper surface of the silicon oxide film 213, reflecting the shape of the upper surface of the polyacetylene film 211 which includes the upper surface of the upper wiring layer 211a, is flat.

The silicon oxide film 213 is provided with a via hole 216 that reaches the upper wiring layer 211a. The diameter of the via hole 216 in this example of the embodiment of the present invention is approximately 0.35 $\mu$m.

The surface of the silicon oxide film 213 which includes the through hole 216 is covered by a second polyacetylene film 221. The film thickness of this second polyacetylene film 221 is, for example, 500 nm. A second prescribed region of the polyacetylene film 221 which minimally includes the inside of the contact hole 216 is selectively converted so as to be electrically conductive, thereby forming the second upper wiring layer 221a.

The line width and interval of the upper wiring layer 221a are approximately 0.45 $\mu$m and approximately 0.4 $\mu$m, respectively. The upper wiring layer 221a is electrically connected to the upper wiring layer 221a via the contact hole 216. The upper surface of the polyacetylene film 221 and the upper surface of the upper wiring layer 221a are continuous and flat surfaces. The upper surface of the polyacetylene film 221 which includes the upper surface of the upper wiring layer 221a is covered with a surface protective film made of a silicon oxide film 223 having a film thickness of, for example, approximately 0.5 μm.

Figure 6:
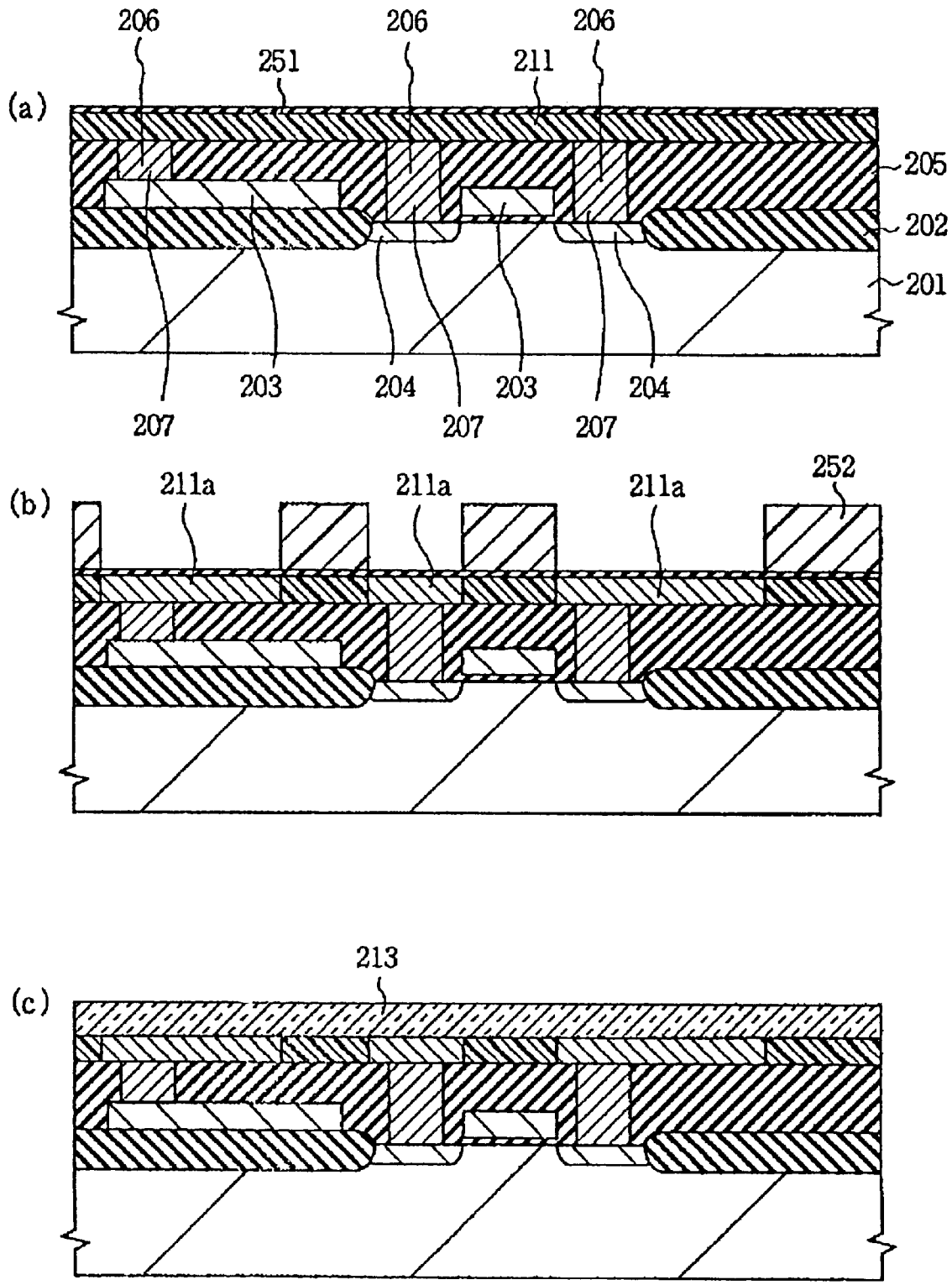
FIGS. 6A–C is a schematic cross-sectional view of an example of the manufacturing process in the above-noted second embodiment of the present invention.

Referring to FIG. 6 which show schematic cross-sectional views of the manufacturing process for a semiconductor device and FIG. 7 and FIG. 5 which show the schematic cross-sectional view of the semiconductor device, a semiconductor device of this example of the second embodiment of the present invention is formed as follows.

First, on a device isolation region of the P-type silicon substrate 201 a field oxide film 202 is formed. After a gate oxide film (not shown in the drawing) is formed on the device region of the surface of the P-type silicon substrate 201, a gate electrode 203 is formed. Then, an $N^+$ type diffusion layer 204 is formed on the device region of the surface of the P-type silicon substrate.

By using a CVD, CMP or other process a first interlayer insulating film 205 said formed having a flattened top surface, this serving to cover the n-channel MOS transistor provided on the surface of the P-type silicon substrate 201, including the field oxide film 202 and the gate electrode 203. The interlayer insulating film 205 has formed on it a contact hole which reaches the lower wiring layer of, for example, these gate electrode 203 and $N^+$ type diffusion layer.

Contact plugs 207 which includes a metallic material are formed, these contact plugs 207 filling the contact hole 206. Next, by plasma polymerization of, for example acetylene, a first polyacetylene insulating film 211 is formed over the entire surface to a film thickness of approximately 500 nm.

Oxygen plasma processing is performed with respect to the surface of the polyacetylene film 211, this converting the surface of the polyacetylene film 211 from hydrophobic to hydrophilic. Next, a silicon oxide film 251 having a film thickness of approximately 10 nm is formed as a first non-organic insulating film over the entire surface, using an ECR-PECVD process.

Next, a first photoresist film 252 having an aperture part on the top of the polyacetylene film 211 that minimally includes the top of the contact hole 207 is formed over the surface of the silicon oxide film 251. Ion implantation of AsF5 or I2 is done, using the photoresist film 252 as a mask, thereby converting the first prescribed region of the polyacetylene film 211 so as to be electrically conductive so as to form the first upper wiring layer 211a from this polyacetylene film (FIG. 6 (b)).

Next, the photoresist film 252 is removed by ashing using plasma, and the silicon oxide film 251 is removed using buffered hydrofluoric acid or the like. Then, for example, a silicon oxide film 213 (which is a non-organic interlayer insulating film) is formed over the entire surface to a film thickness of approximately 600 nm (FIG. 6 (c)).

The method of forming this silicon oxide film 213 is that of using an ECR-CVD or an LPD process. If an LPD process is used, this is performed while dripping an aqueous solution of boric acid ($H_3BO_3$) into a supersaturated aqueous solution of hexafluorosilicate ($H_2SiF_6$). In the second embodiment of the present invention, there is no limitation to using a silicon oxide film as the second non-organic film, and it is possible to use a silicon nitride film formed by using a ECR-CVD process, or a laminate of such a silicon nitride film with the above-noted silicon oxide film.

Next, by performing anisotropic etching of the silicon oxide film, using the second photoresist film (not shown in the drawing) as a mask, a via hole 216 that reaches the upper wiring layer 211a is formed in the silicon oxide film 213. Then, the second photoresist film is peeled off using an organic solvent. In this example of the second embodiment of the present invention, the series of process steps related to the formation of the via hole 216 are simpler than the above-described example of the first embodiment.

Because the aspect ratio of the via hole 216 is lower than the aspect ratio of the via hole of the above-described example of the first embodiment, in this example of the second embodiment, it is not actually necessary to form a second contact plug by means of a polyacetylene film. A second polyacetylene insulating film 221 is formed over the entire surface to a film thickness of 500 nm, and a second prescribed region of this polyacetylene film 221 which minimally includes the via hole 216 is converted so as to be electrically conductive, thereby forming the second upper wiring layer 221a.

Figure 7:
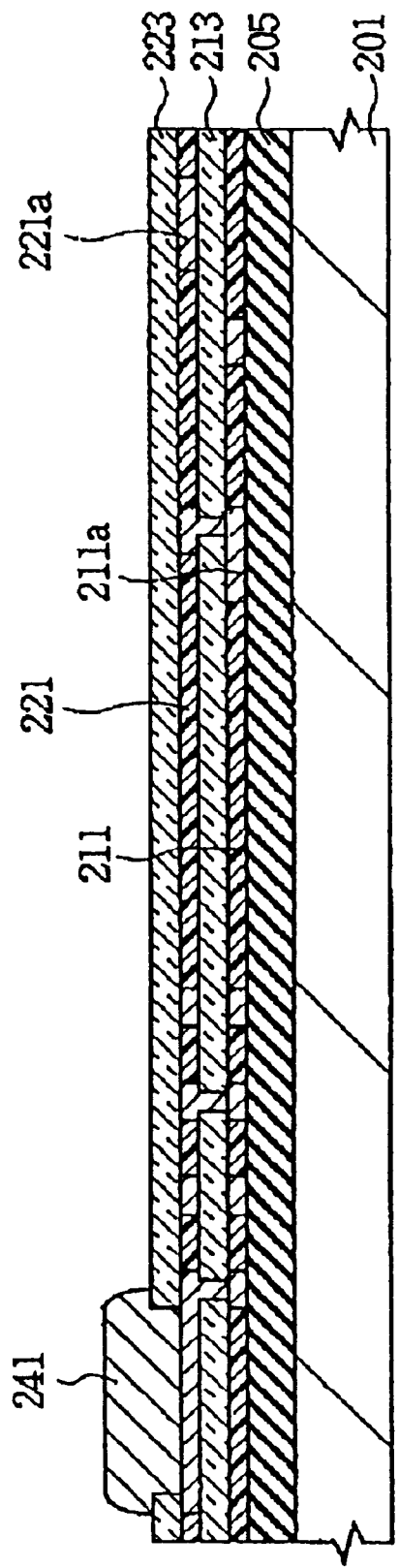
FIG. 7 is a schematic cross-sectional view of an example of the above-noted second embodiment of the present invention.
Figure 8:
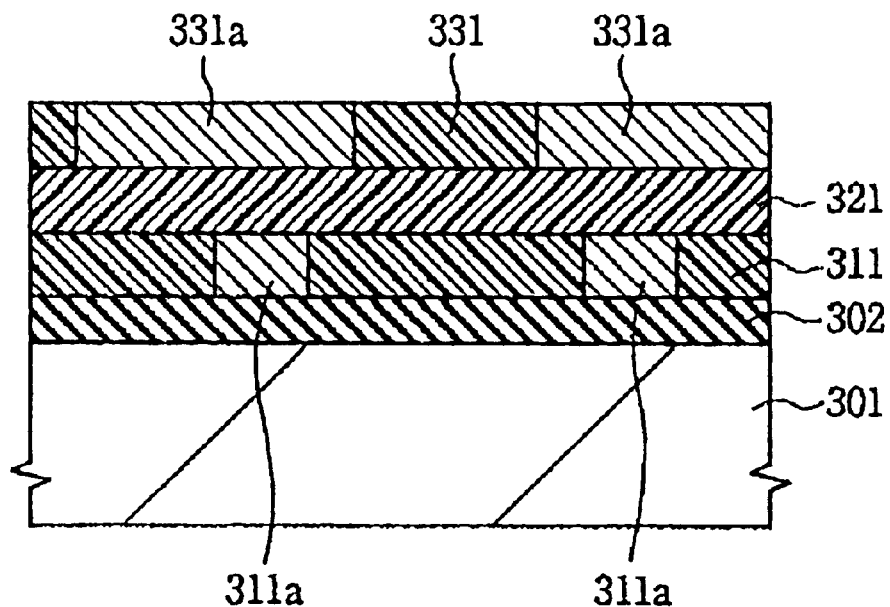
FIG. 8 is a schematic cross-sectional view of a semiconductor device according to the prior art.
Figure 9:
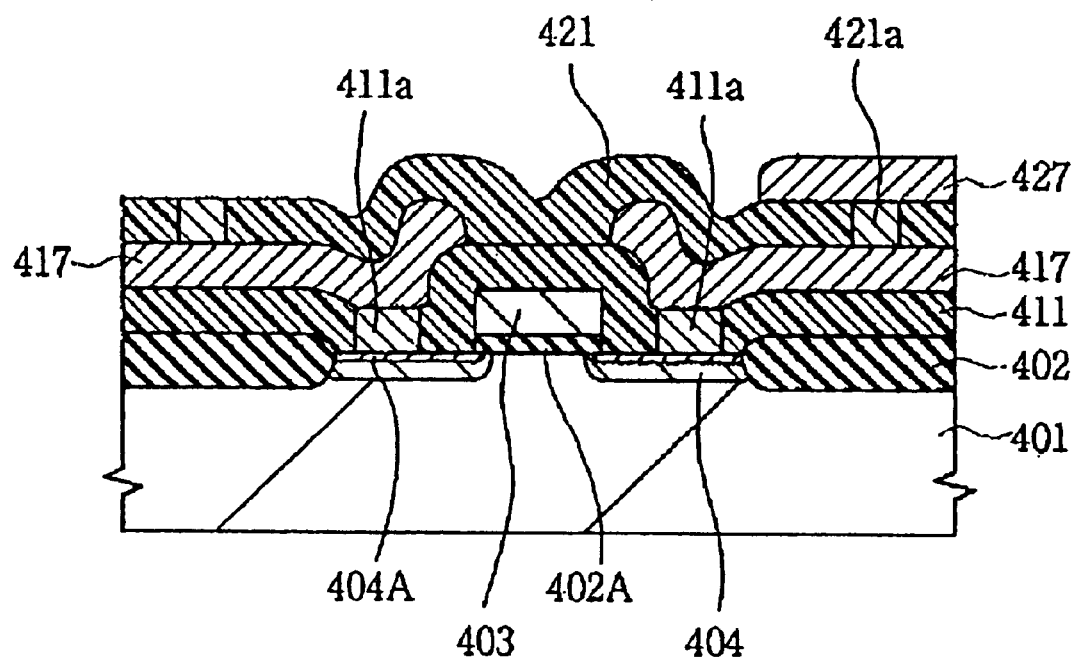
FIG. 9 is a schematic cross-sectional view of a semiconductor device according to the prior art.

Then, an ECR-CVD or an LPD process is used to form a surface protective film made from a silicon oxide film 223 having a film thickness of approximately 0.5 μm, a bonding pad is formed on this silicon oxide film 223, and a metal bump 241 is further formed thereon (FIG. 5 and FIG. 7).

This example of the second embodiment of the present invention has the effect of the above-described example of the first embodiment and in addition, compared with the example of the first embodiment, it simpler to manufacture.

Even in the above-described example of the second embodiment, although the lower wiring layer is the $N^+$ type diffusion layer and gate electrode of an n-channel MOS transistor formed on the P-type silicon substrate, the second embodiment imposes no such limitation. Additionally, in this second embodiment as well there is no limitation to the various specific parameter values given herein by way of examples.

According to the present invention, as described in detail above, because it is possible to perform selective impurity doping of a prescribed region of an insulating polyacetylene film without hindrance, these doped polyacetylene films are easy to use in forming wiring layers, including the filling of a via hole which is formed in an interlayer insulating film that is disposed between the polyacetylene films of the upper and lower layers.

In addition, because the second interlayer insulating film between the polyacetylene film of the lower layer which includes the first upper wiring layer and the polyacetylene film of the upper layer which includes the second upper wiring layer is formed so as to include a non-organic interlayer insulating film, it is possible to form the second upper wiring layer without causing problems with regard to the first upper wiring layer. Additionally, it is easy to electrically connect the second upper wiring layer to the first upper wiring layer via a via hole that is provided in the second interlayer insulating film.

Additionally, according to the present invention because the lower layer polyacetylene film which includes the first upper wiring layer is a flat film, the second interlayer insulating film which includes a non-organic interlayer insulating film is a flat film and, reflecting this, the polyacetylene film of the upper layer which includes the second upper wiring layer is also a flat film. For this reason, when forming the second upper wiring layer, for example, a problem with regard to depth of field that is attributable to unevenness of the upper surface of the base are avoided, so that it is easy to form the second upper wiring layer, for example.

What is claimed is:

1. A semiconductor device comprising:
   a lower wiring layer that is provided on a surface or above a surface of a semiconductor substrate;
   a first interlayer insulating film which covers said lower wiring layer, which has a flattened upper surface, and which has a contact hole that extends to said lower wiring layer;
   a contact plug that fills said contact hole and which is formed so as to include a metallic material;
   a first insulating polyacetylene ((CH2)x) film which covers the entire surface of said first interlayer insulating film;
   a first upper wiring layer which covers a first region of said first polyacetylene film that minimally includes the top edge of said contact plug and which is formed by selective conversion of said first polyacetylene film so as to be electrically conductive;
   a second interlayer insulating film which covers the entire of said first polyacetylene film, including said first upper wiring layer, which is formed as a laminated film that minimally includes a non-organic insulating film and a polyimide film, and which has a via hole that extends to said first upper wiring layer;
   a second insulating polyacetylene film which covers the entirety of said second interlayer insulating film; and
   a second upper wiring layer that is provided over a second region of said second polyacetylene film, which minimally includes said via hole, and which is formed by selective conversion of said second polyacetylene film so as to make it electrically conductive.

2. A semiconductor device according to claim 1, wherein said via hole is filled by a second contact plug formed from a conductive third polyacetylene film.

3. A semiconductor device according to claim 1 further comprising a surface protective film that covers said second polyacetylene film, including said second upper wiring layer, and an aperture provided in said surface protection film and further comprising a metal bump which is provided at an aperture in said surface protective film.

4. A semiconductor device according to claim 3, wherein said surface protective film is formed by at least one member of a group consisting of a silicon oxide film, a silicon nitride film, and a polyimide film.

5. A semiconductor device comprising:
   a lower wiring layer that is provided on a surface or above a surface of a semiconductor substrate;
   a first interlayer insulating film which covers said lower wiring layer, which has a flattened upper surface, and which has a contact hole that extends to said lower wiring layer;
   a contact plug that fills said contact hole and which is formed so as to include a metallic material;
   a first insulating polyacetylene film which covers the entire surface of said first interlayer insulating film;
   a first upper wiring layer which covers a first region of said first polyacetylene film that minimally includes the top edge of said contact plug and which is formed by selective conversion of said first polyacetylene film so as to be electrically conductive;
   a second interlayer insulating film which covers the entire of said first polyacetylene film, including said first upper wiring layer, which is formed by at least one of a group consisting of a silicon oxide film and a silicon nitride film, and which has a via hole that extends to said first upper wiring layer;
   a second insulating polyacetylene film which covers the entirety of said second interlayer insulating film; and
   a second upper wiring layer that is provided over a second region of said second polyacetylene film, which minimally includes said via hole, and which is formed by selective conversion of said second polyacetylene film so as to make it electrically conductive.

6. A semiconductor device according to claim 5, wherein said via hole is filled by a second contact plug formed from a conductive third polyacetylene film which is converted from insulating polyacetylene.

7. A semiconductor device according to claim 5 further comprising a surface protective film that covers said second polyacetylene film, including said second upper wiring layer, and an aperture provided in said surface protective film and further comprising a metal bump which is provided at an aperture in said surface protective film.

8. A semiconductor device according to claim 7, wherein said surface protective film is formed by at least one member of a group consisting of a silicon oxide film, a silicon nitride film, and a polyimide film.

9. A semiconductor device manufacturing method comprising the following steps:
   forming a first interlayer insulating film made from a silicon insulating film that covers a lower wiring layer and is provided on a surface or above a surface of a conductive substrate, the upper surface of a first interlayer insulating film being flattened, a contact hole being provided on said first interlayer insulating film,
   forming a barrier conductive film and a metallic layer over the entire surface of said first interlayer insulating film by etching back, and forming a contact plug in said contact hole;
   forming a first polyacetylene insulating film over the entire surface of said first interlayer insulating film, the surface of said first polyacetylene film being converted by oxygen plasma processing so as to make it hydrophilic,
   forming a first non-organic insulating film over the entire surface of said first polyacetylene insulating film;
   forming the surface of said first non-organic insulating film onto a first photoresist film having an aperture part in a first region, ion implantation of an impurity using said first photoresist film as a mask being used to convert a first region of said first polyacetylene film to be electrically conductive, thereby forming a first upper wiring layer;
   removing said first photoresist film with ashing by means of oxygen plasma and further selectively removing said first non-organic insulating film;
   successively forming over the entire surface of said first polyacetylene film a second non-organic insulating film, a polymide film, and a third non-organic insulating film;
   anisotropically etching with respect to said third non-organic insulating film, using a second photoresist film as a mask, whereby RIE by oxygen gas is used to perform anisotropic etching of said polyimide film, said second photoresist film being thereby removed, and minimally anistropically etching an exposed part of said second non-organic insulating film to selectively remove said second non-organic insulating film, thereby forming a via hole which reaches said first upper wiring layer;
   forming a second insulating polyacetylene film over the entire surface of said polyacetylene film, said second polyacetylene film being etched back by RIE using oxygen gas, thereby leaving said second polyacetylene film only inside said through hole, said second polyacetylene film being converted so as to be electrically conductive, thereby forming a second contact plug that is formed by said second polyacetylene films;

forming a third insulating polyacetylene film on the entire surface of said second insulating polyacetylene film; and selectively converting a second region of said third polyacetylene film to be electrically conductive, thereby forming a second upper wiring layer.

10. A semiconductor device manufacturing method according to claim 9 wherein the first, second, or third non-organic insulating film is a silicon oxide film or a silicon nitride film formed by using a plasma excitation gas-phase growth process (ECR-PECVD) using an electron cyclotron resonance.

11. A semiconductor device manufacturing method according to claim 9 wherein forming said second polyacetylene insulating film is formed by polymerizing acetylene (C2H2) using a Ziegler-Natta catalyst, the conversion of said second polyacetylene insulating film so as to be electrically conductive formed by either gas-phase or liquid-phase diffusion.

12. A semiconductor device manufacturing method according to claim 9 further comprising a step of forming a surface protective film that covers the entire said third polyacetylene film, including said second upper wiring layer, forming an aperture in said surface protective film, and forming a metal bump at said aperture.

13. A semiconductor device manufacturing method comprising:

forming a first interlayer insulating film made from a silicon insulating film having an upper surface and a lower surface on a lower wiring layer that is provided on a surface or above a surface of a conductive substrate, an upper surface of said first interlayer insulating film being flattened, a contact hole being provided on said first interlayer insulating film, successively forming a barrier semiconductor film and a metallic layer over the entire surface by etching back, forming a contact plug in said contact hole;

forming a first polyacetylene insulating film over the entire surface of said first interlayer insulating film, the surface of said first polyacetylene film being converted by oxygen plasma processing so as to make it hydrophilic, forming a first non-organic insulating film over the entire surface of said first polyacetylene film;

forming said first non-organic insulating film onto a first photoresist film having an aperture part in a first region, ion implantation of an impurity using said first photoresist film as a mask being used to convert a first region of said first polyacetylene film to be electrically conductive, thereby forming a first upper wiring layer;

removing said first photoresist film with ashing by means of oxygen plasma and further selectively removing said first non-organic insulating film;

forming over the entire surface of said first polyacetylene film a second interlayer insulating film from a non-organic insulating film;

anisotropically etching said second interlayer insulating film using a second photoresist film as a mask, thereby forming a via hole which reaches said first upper wiring layer, and further removing said second photoresist film by using an organic solvent; and forming a second insulating polyacetylene film over the entire surface of said second interlayer insulating film, converting to be electrically conductive a second region of said second insulating polyacetylene film, thereby forming said second upper wiring layer.

14. A semiconductor device manufacturing method according to claim 13, wherein said first non-organic insulating film is a silicon oxide film or a silicon nitride film formed by using an ECR-PECVD process.

15. A semiconductor device manufacturing method according to claim 13, wherein said second non-organic insulating film includes at least one member of a group consisting of a silicon oxide film and a silicon nitride film formed by using an ECR-PECVD process.

16. A semiconductor device manufacturing method according to claim 13, wherein said second non-organic insulating film is formed by using a liquid-phase deposition (LPD) process.

17. A semiconductor device manufacturing method according to claim 13, further comprising a step of forming a surface protective film that covers the entire said second polyacetylene film, including said second upper wiring layer, forming an aperture in said surface protective film, and forming a metal bump at said aperture.

* * * * *